(12) United States Patent
Choi et al.

(10) Patent No.: US 8,441,877 B2
(45) Date of Patent: May 14, 2013

(54) SEMICONDUCTOR MEMORY DEVICES INCLUDING BURN-IN TEST CIRCUITS

(75) Inventors: Jong-Hyun Choi, Suwon-si (KR);
Sang-Seok Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 541 days.

(21) Appl. No.: 12/731,749

(22) Filed: Mar. 25, 2010

(65) Prior Publication Data
US 2010/0246300 A1    Sep. 30, 2010

(30) Foreign Application Priority Data

Mar. 25, 2009  (KR) .................. 10-2009-0025600

(51) Int. Cl.
*G11C 7/00*    (2006.01)
(52) U.S. Cl.
USPC ............ 365/203; 365/201; 365/205; 365/207
(58) Field of Classification Search .................. 365/203, 365/205, 207, 201
See application file for complete search history.

(56) References Cited

U.S. PATENT DOCUMENTS

2005/0088881 A1* 4/2005 Miki et al. ............... 365/189.09
2007/0076495 A1* 4/2007 Mochida et al. ............... 365/201
2007/0147159 A1* 6/2007 Lee ................................ 365/227
2009/0268534 A1* 10/2009 Kubouchi et al. ............. 365/201

FOREIGN PATENT DOCUMENTS

| JP | 2004-207735 | 7/2004 |
|---|---|---|
| KR | 100185643 B1 | 12/1998 |
| KR | 100206714 B1 | 4/1999 |
| KR | 1020060112374 A | 11/2006 |
| KR | 1020080028544 A | 4/2008 |
| KR | 1020080033815 A | 4/2008 |
| KR | 1020080041460 A | 5/2008 |
| KR | 1020080057385 A | 6/2008 |
| WO | WO 2007/133837 A2 | 11/2007 |

* cited by examiner

*Primary Examiner* — Richard Elms
*Assistant Examiner* — Hien Nguyen
(74) *Attorney, Agent, or Firm* — Myers Bigel Sibley & Sajovec, P.A.

(57) ABSTRACT

A semiconductor memory device includes a memory cell array including a first memory cell coupled to a first bit line and a word line, and a second memory cell coupled to a second bit line and the word line and disposed adjacent to the first memory cell. A controller circuit is configured to provide first and second precharge voltages to the first and second bitlines, respectively. The first precharge voltage is provided as a positive power supply voltage and the second precharge voltage is provided as a negative stress voltage during a burn-in test operation. Related methods of operation are also discussed.

20 Claims, 4 Drawing Sheets

SEMICONDUCTOR MEMORY DEVICES INCLUDING BURN-IN TEST CIRCUITS

CROSS-REFERENCE TO RELATED APPLICATION

This application claims the benefit of priority under 35 U.S.C. §119 from Korean Patent Application No. 10-2009-0025600, filed on Mar. 25, 2009, the disclosure of which is hereby incorporated herein by reference in its entirety.

BACKGROUND

Example embodiments relate to integrated circuit memory devices and methods of operating the same.

With an increase in the degree of integration of semiconductor memory devices, circuit elements included in semiconductor memory devices may become miniaturized as well. Thus, process margins in semiconductor memory device fabrication processes for forming the circuit elements may be reduced. As a result, the probability of a micro-bridge defect occurring between adjacent memory cells may increase. A "micro-bridge defect" may refer to a phenomenon in which leakage current may occur due to a current path unintentionally formed between adjacent memory cells. When a micro-bridge defect occurs between memory cells, data stored in the memory cells may be lost.

SUMMARY

Example embodiments provide a semiconductor memory device in which a micro bridge that may be formed in the process of fabricating the semiconductor memory device can be effectively reduced and/or removed.

According to some embodiments, an integrated circuit memory device includes a memory cell array including a first memory cell coupled to a first bit line and a word line, and a second memory cell coupled to a second bit line and the word line and disposed adjacent to the first memory cell. A controller circuit is configured to provide first and second precharge voltages to the first and second bitlines, respectively. During a burn-in test mode of operation, the first precharge voltage is a positive power supply voltage and the second precharge voltage is a negative stress voltage.

In some embodiments, the first and second bitlines may be immediately adjacent bit lines, and a difference between the positive power supply voltage and the negative stress voltage may be sufficient to reduce and/or remove a current path between the first and second memory cells.

In some embodiments, the memory device may further include a first precharge circuit configured to precharge the first bit line to the first precharge voltage in response to a first precharge signal, and a second precharge circuit configured to precharge the second bit line to the second precharge voltage in response to a second precharge signal. The controller circuit may be configured to output the first and second precharge signals to the first and second precharge circuits in response to an external instruction.

In some embodiments, the controller circuit may be further configured to provide the first and second precharge voltages at a reference voltage during a normal mode of operation.

In some embodiments, the controller circuit may include a precharge voltage generator, a stress voltage supply, and a precharge voltage transmitter. The precharge voltage generator may be configured to generate the reference voltage having a predetermined voltage level. The stress voltage supply may be configured to apply, during the burn-in test mode of operation, the power supply voltage to a first terminal through which the first precharge voltage is output and the negative stress voltage to a second terminal through which the second precharge voltage is output. The precharge voltage transmitter may be configured to electrically isolate the precharge voltage generator from the first and second terminals in response to a transmission control signal activated during the burn-in test mode of operation, and may be configured to provide the reference voltage to the first and second terminals during the normal mode of operation.

In some embodiments, the memory device may further include a first pad connected to the first terminal to which the power supply voltage is applied during the burn-in test operation, and a second pad connected to the second terminal to which the negative stress voltage is applied during the burn-in test operation.

In some embodiments, the stress voltage supply may include first and second switching circuits. The first switching circuit may be connected between the power supply voltage and the first terminal, and may be configured to provide the power supply voltage to the first terminal in response to the transmission control signal during the burn-in test mode of operation. The second switching circuit may be connected between the negative stress voltage and the second terminal, and may be configured to provide the negative stress voltage to the second terminal in response to the transmission control signal during the burn-in test mode of operation.

In some embodiments, the precharge voltage transmitter may include an inverter, a first transmission gate, and a second transmission gate. The inverter may be configured to invert the transmission control signal and output the inverted transmission control signal therefrom. The first transmission gate may be connected between the precharge voltage generator and the first terminal, and may be configured to electrically connect the first terminal to the precharge voltage generator or electrically isolate the first terminal from the precharge voltage generator in response to the transmission control signal and the inverted transmission control signal output from the inverter. The second transmission gate may be connected between the precharge voltage generator and the second terminal, and may be configured to electrically connect the second terminal to the precharge voltage generator or electrically isolate the second terminal from the precharge voltage generator in response to the transmission control signal and the inverted transmission control signal output from the inverter.

In some embodiments, the inverter may be connected to a first voltage having a positive voltage level and a second voltage having a negative voltage level, and may be configured to output the second voltage when the transmission control signal is activated and output the first voltage when the transmission control signal is deactivated. For example, the first voltage may be the power supply voltage, and the negative stress voltage and the second voltage may be a back bias voltage.

In some embodiments, the first transmission gate may include a first p-type metal oxide semiconductor (PMOS) transistor having source/drain terminals connected to the precharge voltage generator and the first terminal and a gate terminal to which the transmission control signal is applied, and a first n-type metal oxide semiconductor (NMOS) transistor having source/drain terminals connected to the precharge voltage generator and the first terminal and a gate terminal to which the inverted transmission control signal output from the inverter is applied.

In some embodiments, the second transmission gate may include a second p-type metal oxide semiconductor (PMOS)

transistor having source/drain terminals connected to the precharge voltage generator and the second terminal and a gate terminal to which the transmission control signal is applied, and a second n-type metal oxide semiconductor (NMOS) transistor having source/drain terminals connected to the precharge voltage generator and the second terminal and a gate terminal to which the inverted transmission control signal output from the inverter is applied.

In some embodiments, the first and/or second NMOS transistors may include a p-type substrate, an n-band region formed in the p-type substrate, a p-well formed in the n-band region, a first n+ source/drain region and a second n+ source/drain region formed in the p-well and spaced apart from each other by a predetermined distance, and a gate electrode between the first n+ region and the second n+ region. The first n+ source/drain region may be coupled to an output of the precharge voltage generator, and the second n+ source/drain region may be coupled to one of the first terminal and the second terminal.

In some embodiments, the first and/or second NMOS transistors may further include a third n+ region and a fourth n+ region formed in the n-band region on opposite sides of the p-well. The third and fourth n+ regions may be connected to the power supply voltage, and the gate electrode may be coupled to an output of the inverter.

In some embodiments, the first and/or second NMOS transistors may further include a p+ region formed in the p-well between the second n+ source/drain region and the fourth n+ region. The p+ region may be coupled to the second voltage.

In some embodiments, the n-band region may separate the second n+ source/drain region and the p-well from the p-type substrate.

According to further embodiments, an integrated circuit memory device includes a memory cell array including first and second memory cells having a leakage current path therebetween, first and second bit lines coupled to the first and second memory cells, respectively, and a controller circuit coupled to the first and second bit lines. The controller circuit is operable to provide first and second precharge voltages to the first and second bitlines, respectively. During a burn-in test mode of operation, a difference between the first and second precharge voltages is sufficient to reduce and/or remove the leakage current path between the first and second memory cells.

According to some embodiments, the controller may be operable to provide a positive power supply voltage as the first precharge voltage and a negative stress voltage as the second precharge voltage during the burn-in test mode of operation.

According to some embodiments, the first and second bitlines may be immediately adjacent bit lines, and the memory device may further include a word line coupled to the first and second memory cells.

According to some embodiments, the controller circuit may be operable to provide a reference voltage as the first and second precharge voltages during a normal mode of operation.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EMBODIMENTS

Figure 1:
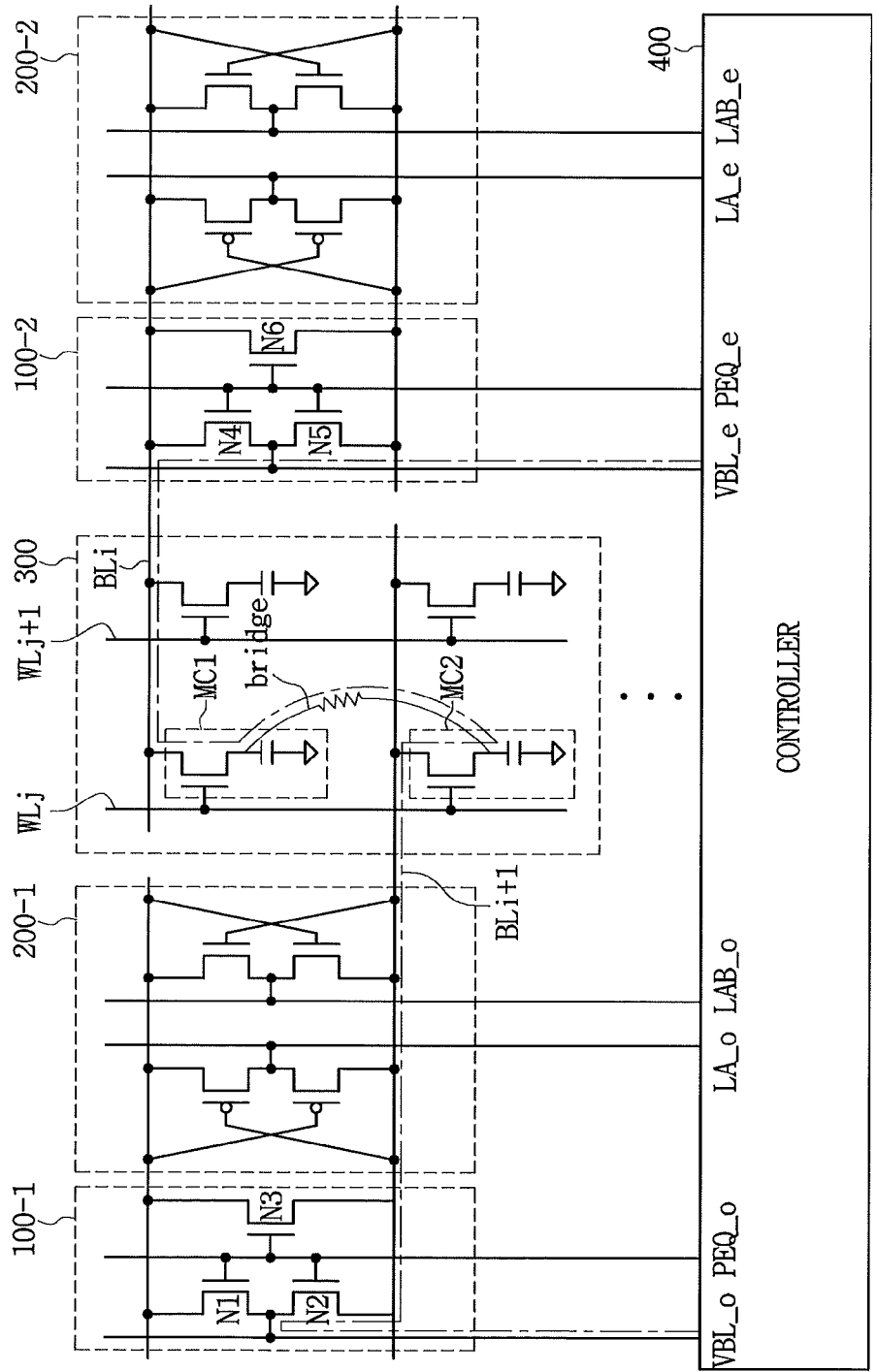
FIG. 1 is a diagram showing a configuration of a semiconductor memory device according to example embodiments.

Various example embodiments will now be described more fully with reference to the accompanying drawings in which some example embodiments are shown. In the drawings, the thicknesses of layers and regions may be exaggerated for clarity. Detailed illustrative embodiments are disclosed herein. However, specific structural and functional details disclosed herein are merely representative for purposes of describing example embodiments. This inventive concept, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent" or "immediately adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

In order to more specifically describe example embodiments, memory devices according to example embodiments will be described in detail with reference to the attached drawings. However, the inventive concept is not limited to the example embodiments described herein.

FIG. 1 is a diagram showing a configuration of an integrated circuit memory device according to example embodiments. The memory device may include a first precharger 100-1, a second precharger 100-2, a first sense amplifier unit 200-1, a second sense amplifier unit 200-2, a memory cell array 300, and a controller 400. The first precharger 100-1 may include three N-type metal oxide semiconductor (NMOS) transistors N1, N2 and N3, and the second precharger 100-2 may include three NMOS transistors N4, N5 and N6. Each of the first and second sense amplifier units 200-1 and 200-2 may include a P-type metal oxide semiconductor (PMOS) sense amplifier including two PMOS transistors and an NMOS sense amplifier including two NMOS transistors. In FIG. 1, the line labeled "bridge" denotes a micro bridge that may be formed in the process of fabricating the memory device, and a dash dotted line denotes a current path formed by a stress voltage applied to reduce and/or remove the micro bridge during a testing operation, such as a burn-in test operation.

Functions of the respective blocks shown in FIG. 1 will be described below.

The first precharger 100-1 precharges a first bit line BLi+1 and a bit line disposed adjacent to the first bit line BLi+1 to a first precharge voltage VBL_o applied from the controller 400 in response to a first precharge signal PEQ_o from the controller 400, and the second precharger 100-2 precharges a second bit line BLi and a bit line disposed adjacent to the second bit line BLi to a second precharge voltage VBL_e applied from the controller 400 in response to a second precharge signal PEQ_e from the controller 400.

The first sense amplifier unit 200-1 senses and amplifies a signal of the first bit line BLi+1 in response to a first sense amplifier enable signal LA_o and an inverse first sense amplifier enable signal LAB_o from the controller 400, and the second sense amplifier unit 200-2 senses and amplifies a signal of the second bit line BLi in response to a second sense amplifier enable signal LA_e and an inverse second sense amplifier enable signal LAB_e input from the controller 400. The first sense amplifier unit 200-1 may sense and amplify a voltage difference between the first bit line BLi+1 and the bit line disposed adjacent to the first bit line BLi+1, and the second sense amplifier unit 200-2 may sense and amplify a voltage difference between the second bit line BLi and the bit line disposed adjacent to the second bit line BLi.

The memory cell array 300 may include first memory cells MCI connected between the first bit line BLi+1 (which extends in a first direction) and respective word lines WLj and WLj+1, and second memory cells MC2 connected between the second bit line BLi (which extends in the first direction and is disposed adjacent to the first bit line BLi+1) and the respective word lines WLj and WLj+1, and disposed adjacent to the first memory cells MC1. The memory cell array 300 may write/read data to/from a selected memory cell.

The controller 400 outputs the first precharge signal PEQ_o, the second precharge signal PEQ_e, the first sense amplifier enable signal LA_o, the inverse first sense amplifier enable signal LAB_o, the second sense amplifier enable signal LA_e, and the inverse second sense amplifier enable signal LAB_e in response to external instruction and/or address signals. The controller 400 outputs one of the first precharge voltage VBL_o and the second precharge voltage VBL_e at a power supply voltage level and the other at a negative stress voltage level (e.g., a back bias voltage level) during a burn-in test operation, and outputs the first precharge voltage VBL_o and the second precharge voltage VBL_e at the same precharge voltage level during a normal operation.

In other words, in the memory device according to example embodiments, the micro bridge is reduced and/or removed by applying a power supply voltage to one end of the micro bridge and a predetermined negative stress voltage to the other end during a burn-in test operation. For example, during a burn-in test operation, the controller 400 of the semiconductor memory may supply the first precharge voltage VBL_o as the power supply voltage and the second precharge voltage VBL_e as the predetermined negative stress voltage, and activate the first precharge signal PEQ_o and the second precharge signal PEQ_e to a high level. In this case, the first precharge voltage VBL_o that is output from the controller 400 and has the power supply voltage level is applied to one end of the micro bridge through the NMOS transistor N2 of the first precharger 100-1 and the cell transistors of the second memory cells MC2, and the second precharge voltage VBL_e that is output from the controller 400 and has the negative stress voltage level is applied to the other end of the micro bridge through the NMOS transistor N4 of the second precharger 100-2 and the cell transistors of the first memory cells MC1. The micro bridge may be reduced and/or removed by and/or based on a difference between the first precharge voltage VBL_o having the power supply voltage level and the second precharge voltage VBL_o having the negative stress voltage level.

Figure 2:
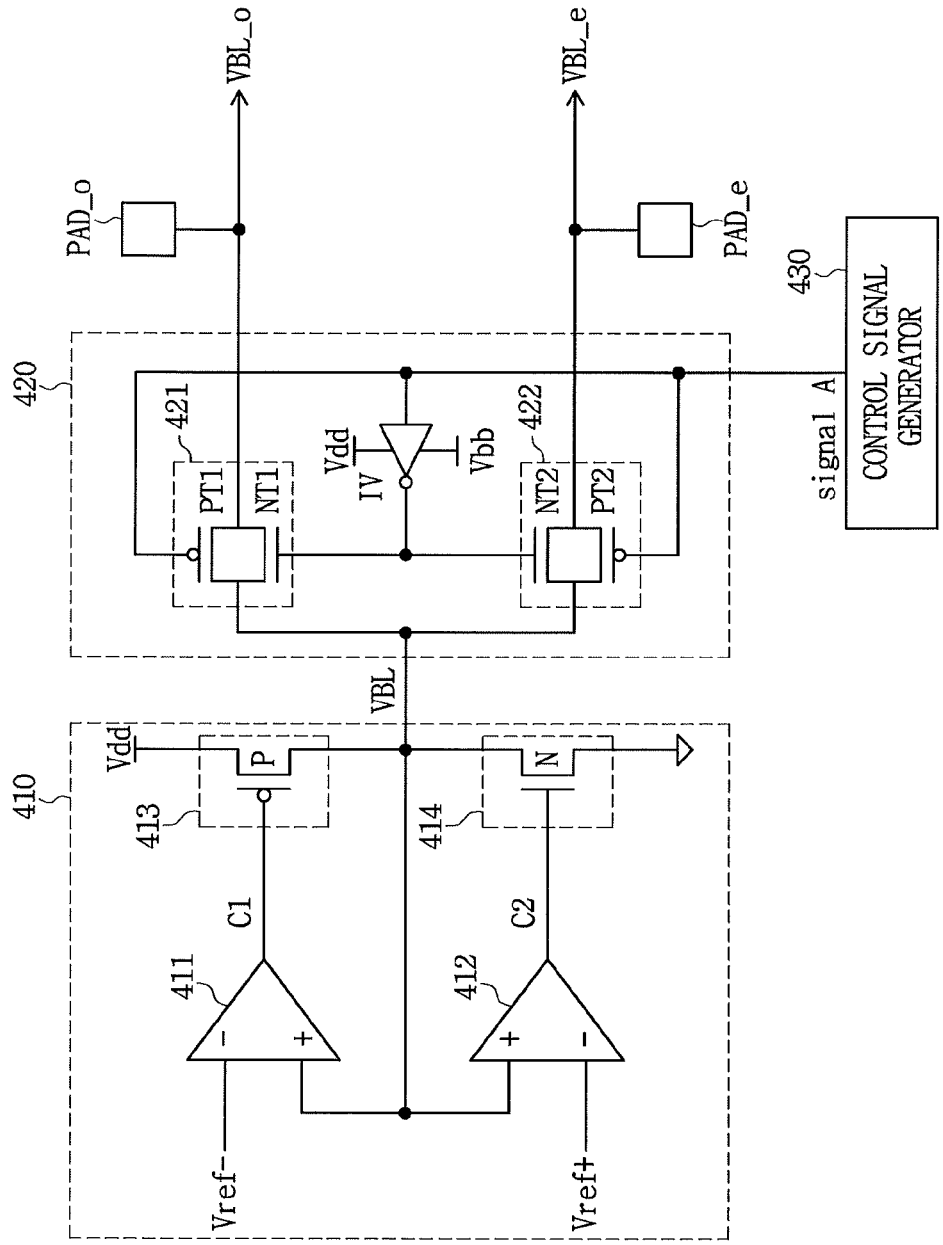
FIG. 2 is a diagram showing a configuration of a precharge voltage generation circuit as a part of a controller of the semiconductor memory device shown in FIG. 1.

FIG. 2 is a diagram showing a configuration of a precharge voltage generation circuit generating the first and second precharge voltages as a part of the controller 400 of the semiconductor memory device of FIG. 1. The precharge voltage generation circuit may include a precharge voltage generator 410, a precharge voltage transmitter 420, a control signal generator 430, a first pad PAD_o, and a second pad PAD_e.

The precharge voltage generator 410 may include a first comparator 411, a second comparator 412, a pull-up unit 413, and a pull-down unit 414. The pull-up unit 413 may include a PMOS transistor P that is connected between a power supply voltage Vdd and a terminal through which a precharge voltage VBL is output and has a gate to which a first comparison signal C1 output from the first comparator 411 is applied. The pull-down unit 414 may include an NMOS transistor N that is connected between the terminal through which the precharge voltage VBL is output and a ground voltage and has a gate to which a second comparison signal C2 output from the second comparator 412 is applied.

The precharge voltage transmitter 420 may include a first transmission gate 421 connected between the precharge voltage generator 410 and a terminal through which the first precharge voltage VBL_o is output, a second transmission gate 422 connected between the precharge voltage generator 410 and a terminal through which the second precharge voltage VBL_e is output, and an inverter IV connected between a predetermined positive voltage (e.g., the power supply voltage Vdd) and a predetermined negative voltage (e.g., a back bias voltage Vbb). The first transmission gate 421 may include a first PMOS transmission transistor PT1 that is connected between the precharge voltage generator 410 and the terminal through which the first precharge voltage VBL_o is output and has a gate to which a transmission control signal signal_A is applied, and a first NMOS transmission transistor NT1 that is connected between the precharge voltage generator 410 and the terminal through which the first precharge voltage VBL_o is output and has a gate to which an output signal of the inverter IV is applied. The second transmission gate 422 may include a second PMOS transmission transistor PT2 that is connected between the precharge voltage generator 410 and the terminal through which the second precharge voltage VBL_e is output and has a gate to which the transmission control signal signal_A is applied, and a second NMOS transmission transistor NT2 that is connected between the precharge voltage generator 410 and the terminal through which the second precharge voltage VBL_e is output and has a gate to which the output signal of the inverter IV is applied.

Functions of the respective blocks shown in FIG. 2 will be described below.

The precharge voltage generator 410 receives a reference voltage and outputs the precharge voltage VBL having a level corresponding to the level of the reference voltage. The reference voltage may consist of a first voltage Vref− having a level that is lower than the level of the reference voltage by a predetermined level, and a second voltage Vref+ having a level that is higher than the level of the reference voltage by a predetermined level.

The first comparator 411 of the precharge voltage generator 410 compares the first voltage Vref− with the precharge voltage VBL and outputs the first comparison signal C1 according to the comparison result, and the second comparator 412 compares the second voltage Vref+ with the precharge voltage VBL and outputs the second comparison signal C2 according to the comparison result. The first comparator 411 may output the first comparison signal C1 of a low level when the precharge voltage VBL is lower than the first voltage Vref−, and output the first comparison signal C1 of a high level when the precharge voltage VBL is higher than the first voltage Vref−. The second comparator 412 may output the second comparison signal C2 of a high level when the precharge voltage VBL is higher than the second voltage Vref+, and output the second comparison signal C2 of a low level when the precharge voltage VBL is lower than the second voltage Vref+.

The pull-up unit 413 of the precharge voltage generator 410 pulls up the precharge voltage VBL in response to the first comparison signal C1, and the pull-down unit 414 pulls down the precharge voltage VBL in response to the second comparison signal C2. To be specific, the pull-up unit 413 raises the precharge voltage VBL in response to the first comparison signal C1 when the precharge voltage VBL is lower than the first voltage Vref−, and the pull-down unit 414 reduces the precharge voltage VBL in response to the second comparison signal C2 when the precharge voltage VBL is higher than the second voltage Vref+.

The first voltage Vref− and the second voltage Vref+ may have the same predetermined reference voltage level. In this case, the PMOS transistor P constituting the pull-up unit 413 and the NMOS transistor N constituting the pull-down unit 414 may be continuously and alternately turned on. To prevent this, the first voltage Vref− may have a level lower than the reference voltage level by the predetermined level, and the second voltage Vref+ may have a level higher than the reference voltage level by the predetermined level, as mentioned above. In this case, the precharge voltage VBL may have a level within a predetermined range from the predetermined reference voltage level.

In response to the transmission control signal signal_A having a "high" level, the precharge voltage transmitter 420 outputs the precharge voltage VBL generated by the precharge voltage generator 410 as the first precharge voltage VBL_o and the second precharge voltage VBL_e. In response to the transmission control signal signal_A having a "low" level, the precharge voltage transmitter 420 electrically isolates or separates the terminal through which the first precharge voltage VBL_o is output and the terminal through which the second precharge voltage VBL_e is output from the precharge voltage generator 410. The transmission control signal signal_A may be activated to the "high" level during a burn-in test operation, and deactivated (e.g., to the "low" level) during a normal operation.

The inverter IV of the precharge voltage transmitter 420 is connected between the predetermined positive voltage (e.g., the power supply voltage Vdd) and the predetermined negative voltage (e.g., the back bias voltage Vbb), inverts the transmission control signal signal_A, and outputs the inverted transmission control signal. To be specific, the inverter IV may output a predetermined negative voltage level (e.g., the level of the back bias voltage Vbb) when the transmission control signal signal_A of a high level is input, and a predetermined positive voltage level (e.g., the level of the power supply voltage Vdd) when the transmission control signal signal_A of a low level is input.

In response to the transmission control signal signal_A and the output signal of the inverter IV, the first transmission gate 421 of the precharge voltage transmitter 420 transmits the precharge voltage VBL generated by the precharge voltage generator 410 to the terminal through which the first precharge voltage VBL_o is output, or separates the precharge voltage generator 410 from the terminal through which the first precharge voltage VBL_o is output. To be specific, when the transmission control signal signal_A is activated to a high level during a burn-in test operation, the inverter IV outputs the signal having the level of the back bias voltage Vbb, the first PMOS transmission transistor PT1 is turned off in response to the transmission control signal signal_A of a high level, and the first NMOS transmission transistor NT1 is turned off in response to the output signal of the inverter IV. As a result, the precharge voltage generator 410 is electrically separated or isolated from the terminal through which the first precharge voltage VBL_o is output. When the transmission control signal signal_A is deactivated to a low level during a normal operation, the inverter IV outputs the signal having the level of the power supply voltage Vdd, the first PMOS transmission transistor PT1 is turned on in response to the transmission control signal signal_A of a low level, and the first NMOS transmission transistor NT1 is turned on in response to the output signal of the inverter IV. As a result, the precharge voltage VBL generated by the precharge voltage generator 410 is transmitted to the terminal through which the first precharge voltage VBL_o is output. Operation of the second transmission gate 422 similar to that of the first transmission gate 421.

The control signal generator 430 outputs the transmission control signal signal_A. Although not shown in the drawing, the control signal generator 430 may include an instruction decoder and a mode setting register. In this case, the instruction decoder may decode an external instruction and output a mode setting instruction, and the mode setting register may decode an address signal input from the outside and output the transmission control signal signal_A in response to the mode setting instruction. Also, although not shown in the drawing, the transmission control signal signal_A may be applied from the outside (e.g., from an external device) during a burn-in test operation. For example, the transmission control signal signal_A may be applied from the outside through a bonding pad, etc., of the memory device during a burn-in test operation.

The first pad PAD_o is connected to the terminal through which the first precharge voltage VBL_o is output, and the second pad PAD_e is connected to the terminal through which the second precharge voltage VBL_e is output. During a burn-in test operation, the power supply voltage Vdd is applied to one of the first pad PAD_o and the second pad PAD_e, and the predetermined negative stress voltage (e.g., the back bias voltage Vbb) is applied to the other pad.

In other words, the precharge voltage generation circuit of the controller 400 of the semiconductor memory device shown in FIG. 2 outputs the precharge voltage of a predetermined reference voltage level to the terminal through which the first precharge voltage VBL_o is output and the terminal through which the second precharge voltage VBL_e is output during a normal operation, and outputs the power supply voltage to one terminal (e.g., the terminal through which the first precharge voltage VBL_o is output) and the predetermined negative stress voltage to the other terminal (e.g., the terminal through which the second precharge voltage VBL_e is output) during a burn-in test operation.

Figure 3:
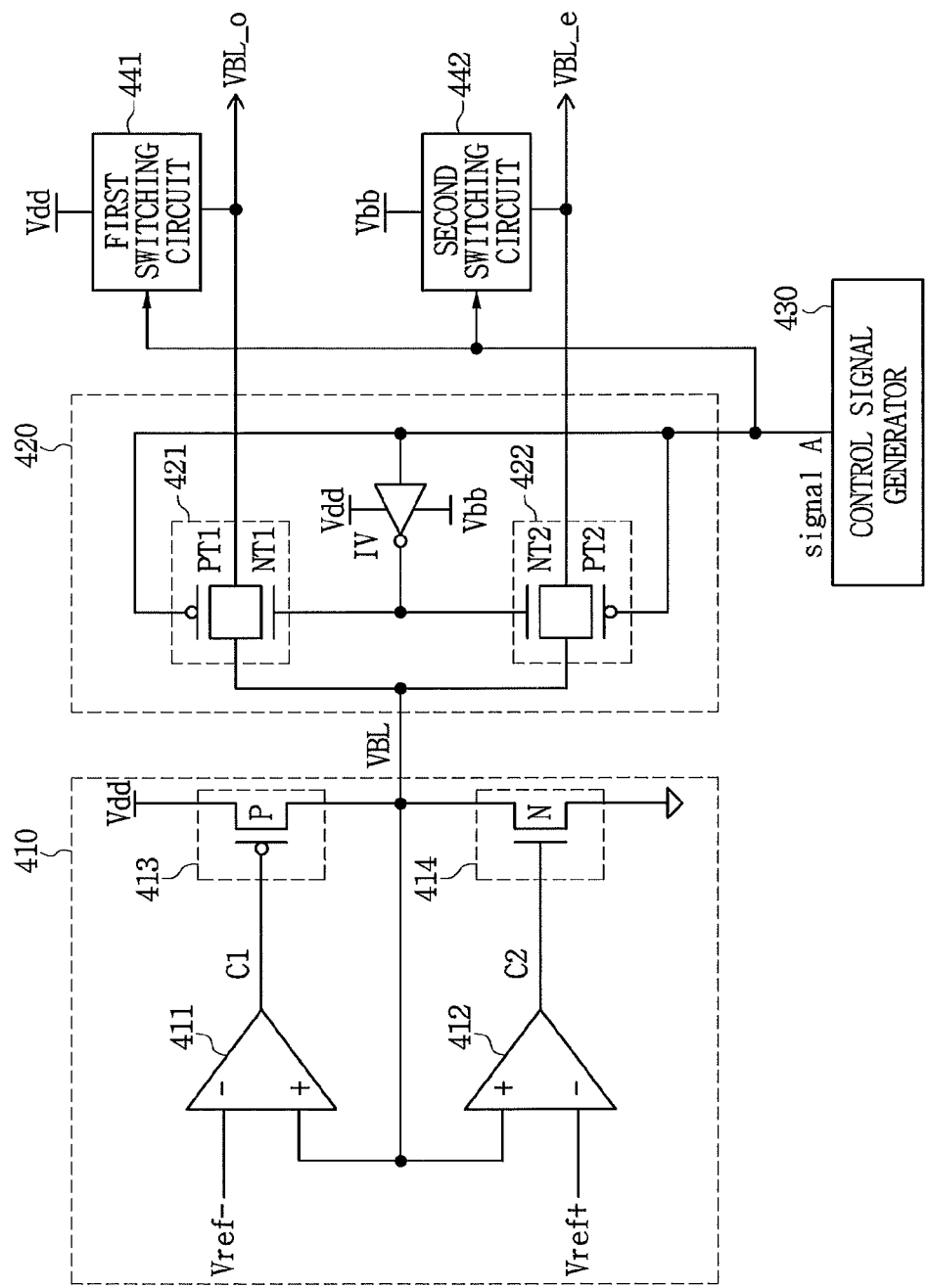
FIG. 3 is a diagram showing another configuration of a precharge voltage generation circuit as a part of the controller of the semiconductor memory device shown in FIG. 1.

FIG. 3 is a diagram showing another configuration of a precharge voltage generation circuit as a part of the controller 400 of the semiconductor memory device of FIG. 1. The precharge voltage generation circuit may include a precharge voltage generator 410, a precharge voltage transmitter 420, a control signal generator 430, a first switching circuit 441, and a second switching circuit 442.

Functions of the respective blocks shown in FIG. 3 will be described below.

The precharge voltage generator 410, the precharge voltage transmitter 420, and the control signal generator 430 function in a similar manner as described with reference to FIG. 2.

The first switching circuit 441 is connected between a power supply voltage Vdd and a terminal through which the first precharge voltage VBL_o is output, and turned on or off in response to the transmission control signal signal_A output by the control signal generator 430. In other words, the first switching circuit 441 applies the power supply voltage Vdd to the terminal through which the first precharge voltage VBL_o is output in response to the transmission control signal signal_A. The second switching circuit 442 is connected between a negative stress voltage (e.g., a back bias voltage Vbb) and a terminal through which a second precharge voltage VBL_e is output, and turned on or off in response to the transmission control signal signal_A output by the control signal generator 430. In other words, the second switching circuit 442 applies the negative stress voltage (e.g., the back bias voltage Vbb having a predetermined negative voltage level) to the terminal through which the second precharge voltage VBL_e is output in response to the transmission control signal signal_A. Each of the first switching circuit 441 and the second switching circuit 442 may consist of a transistor or transmission gate.

In other words, instead of applying the power supply voltage Vdd to one of the terminal through which the first precharge voltage VBL_o is output and the terminal through which the second precharge voltage VBL_e is output and the predetermined negative stress voltage to the other terminal, the precharge voltage generation circuit of the controller 400 of the semiconductor memory device shown in FIG. 3 may have switching circuits respectively connected to the terminal through which the first precharge voltage VBL_o is output and the terminal through which the second precharge voltage VBL_e is output and turned on or off in response to the transmission control signal signal_A. The switching circuits output the power supply voltage Vdd to one of the terminal through which the first precharge voltage VBL_o is output and the terminal through which the second precharge voltage VBL_e is output, and output the predetermined negative stress voltage (e.g., the back bias voltage Vbb) to the other terminal during a burn-in test operation.

Figure 4:
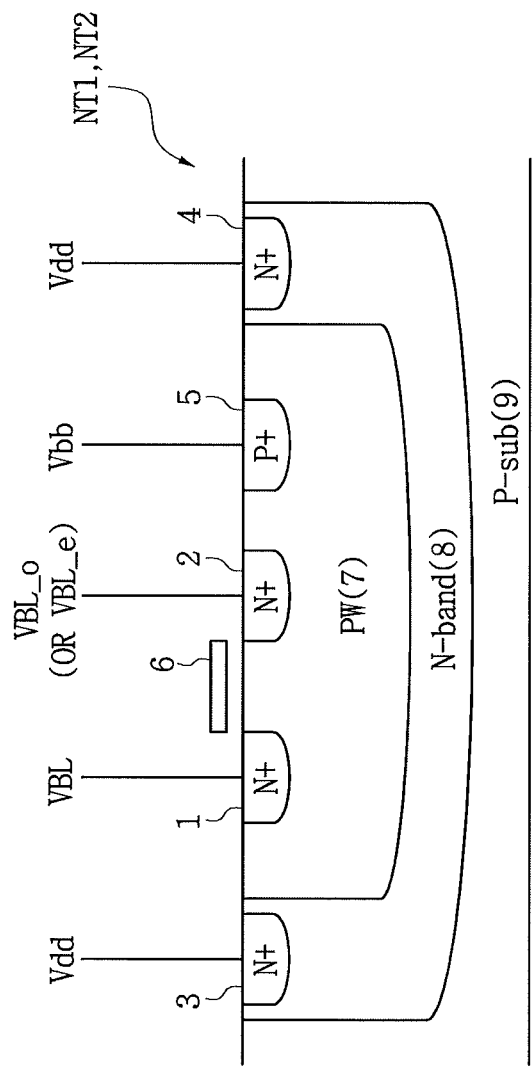
FIG. 4 is a diagram showing a configuration of first and second N-type metal oxide semiconductor (NMOS) transmission transistors in the precharge voltage generation circuits of the semiconductor memory device shown in FIGS. 2 and 3.

FIG. 4 is a diagram showing a configuration of the first and second NMOS transmission transistors NT1 and NT2 of the precharge voltage transmitters 420 in the precharge voltage generation circuits of the controller 400 of the semiconductor memory device shown in FIGS. 2 and 3. Each of the first and second NMOS transmission transistors NT1 and NT2 may include first to fourth N+ regions 1 to 4, a P+ region 5, a gate 6, a P-well 7, an N-band 8, and a P-type substrate 9.

In other words, each of the first and second NMOS transmission transistors NT1 and NT2 may include the P-type substrate 9, the N-band 8 (or isolation layer) formed in the P-type substrate 9, the P-well 7 formed in the N-band 8, the first N+ region 1 and the second N+ region 2 formed in the P-well 7 to be spaced apart from each other by a predetermined distance, the gate 6 disposed above a space between the first N+ region 1 and the second N+ region 2 by a predetermined distance, the third N+ region 3 and the fourth N+ region 4 formed on both ends in the N-band 8, that is, on both sides of the P-well 7 in the N-band 8, and the P+ region 5 formed in the P-well 7. Also, the precharge voltage VBL output by the precharge voltage generator 410 may be applied to the first N+ region 1. The second N+ region 2 of the first NMOS transmission transistor NT1 may be connected to the terminal through which the first precharge voltage VBL_o is output, and the second N+ region 2 of the second NMOS transmission transistor NT2 may be connected to the terminal through which the second precharge voltage VBL_e is output. The output signal of the inverter IV may be applied to the gate 6, the power supply voltage Vdd may be applied to the third and fourth N+ regions 3 and 4, and the back bias voltage Vbb may be applied to the P+ region 5. The ground voltage may be applied to the P-type substrate 9.

In other words, the first and/or second NMOS transmission transistors NT1 and/or NT2 may be implemented in a triple well as shown in FIG. 4. The first and second NMOS transmission transistors NT1 and NT2 have a structure in which the P-type substrate 9 separated from the second N+ region 2 and the P-well 7 by the N-band 8. Thus, when a predetermined negative stress voltage is applied to the second N+ region, it is possible to prevent the transistor from being damaged by forward bias that may be generated between the P-type substrate 9 and the second N+ region 2.

Also, as described above, the output signal of the inverter IV may be applied to the gate 6 of the first and second NMOS transmission transistors NT1 and NT2, and the inverter IV may output a signal having the level of the back bias voltage Vbb when the transmission control signal signal_A is activated. In other words, even if the predetermined negative stress voltage is applied to the second N+ region 2, it is possible to prevent a problem that may occur when the negative stress voltage is applied to the precharge voltage generator 410 through the first N+ region 1 by applying the signal having the level of the back bias voltage Vbb to the gates 6 of the first and second NMOS transmission transistors NT1 and NT2.

Accordingly, during a burn-in test operation for the memory device according to example embodiments, a power supply voltage is applied to one end of a micro bridge, and a predetermined negative stress voltage is applied to the other end. Thus, it is possible to reduce and/or remove the micro bridge without damaging a cell transistor of a memory cell, and prevent the negative stress voltage from affecting other parts of the semiconductor memory device.

The semiconductor memory device according to the example embodiment of FIG. 1 has an open bit line structure, but example embodiments can also be applied to semiconductor memory devices having a folded bit line structure.

As described above, in a memory device according to example embodiments, a micro bridge can be reduced and/or removed by applying an effective stress voltage to a memory cell array without applying a high voltage to a word line, and thus it is possible to prevent the deterioration of a memory cell transistor caused by a high voltage.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

That which is claimed:

1. An integrated circuit memory device, comprising:
   a memory cell array including a first memory cell coupled to a first bit line and a word line, and a second memory cell coupled to a second bit line and the word line and disposed adjacent to the first memory cell; and
   a controller circuit configured to provide first and second precharge voltages to the first and second bitlines, respectively,
   wherein the first precharge voltage comprises a positive power supply voltage and the second precharge voltage comprises a negative stress voltage during a burn-in test mode of operation.

2. The memory device according to claim 1, wherein the first and second bitlines comprise immediately adjacent bit lines, and wherein a difference between the positive power supply voltage and the negative stress voltage is sufficient to remove a current path between the first and second memory cells.

3. The memory device according to claim 1, further comprising:
   a first precharge circuit configured to precharge the first bit line to the first precharge voltage in response to a first precharge signal; and
   a second precharge circuit configured to precharge the second bit line to the second precharge voltage in response to a second precharge signal,
   wherein the controller circuit is configured to output the first and second precharge signals to the first and second precharge circuits in response to an external instruction.

4. The memory device according to claim 3, wherein the controller circuit is further configured to provide the first and second precharge voltages at a reference voltage during a normal mode of operation.

5. The memory device according to claim 1, wherein the controller circuit comprises:
   a precharge voltage generator configured to generate the reference voltage having a predetermined voltage level;
   a stress voltage supply configured to apply, during the burn-in test mode of operation, the power supply voltage to a first terminal through which the first precharge voltage is output and the negative stress voltage to a second terminal through which the second precharge voltage is output; and
   a precharge voltage transmitter configured to electrically isolate the precharge voltage generator from the first and second terminals in response to a transmission control signal activated during the burn-in test mode of operation, and configured to provide the reference voltage to the first and second terminals during the normal mode of operation.

6. The memory device according to claim 5, further comprising:
   a first pad connected to the first terminal to which the power supply voltage is applied during the burn-in test operation; and
   a second pad connected to the second terminal to which the negative stress voltage is applied during the burn-in test operation.

7. The memory device according to claim 5, wherein the stress voltage supply comprises:
   a first switching circuit connected between the power supply voltage and the first terminal, and configured to provide the power supply voltage to the first terminal in response to the transmission control signal during the burn-in test mode of operation; and
a second switching circuit connected between the negative stress voltage and the second terminal, and configured to provide the negative stress voltage to the second terminal in response to the transmission control signal during the burn-in test mode of operation.

8. The memory device according to claim 5, wherein the precharge voltage transmitter includes:
an inverter configured to invert the transmission control signal and output the inverted transmission control signal therefrom;
a first transmission gate connected between the precharge voltage generator and the first terminal, and configured to electrically connect the first terminal to the precharge voltage generator or electrically isolate the first terminal from the precharge voltage generator in response to the transmission control signal and the inverted transmission control signal output from the inverter; and
a second transmission gate connected between the precharge voltage generator and the second terminal, and configured to electrically connect the second terminal to the precharge voltage generator or electrically isolate the second terminal from the precharge voltage generator in response to the transmission control signal and the inverted transmission control signal output from the inverter.

9. The memory device according to claim 8, wherein the inverter is connected to a first voltage having a positive voltage level and a second voltage having a negative voltage level, and is configured to output the second voltage when the transmission control signal is activated and output the first voltage when the transmission control signal is deactivated.

10. The memory device according to claim 9, wherein the first voltage comprises the power supply voltage, and wherein the negative stress voltage and the second voltage comprise a back bias voltage.

11. The memory device according to claim 8, wherein the first transmission gate comprises:
a first p-type metal oxide semiconductor (PMOS) transistor including source/drain terminals connected to the precharge voltage generator and the first terminal, and a gate terminal to which the transmission control signal is applied; and
a first n-type metal oxide semiconductor (NMOS) transistor including source/drain terminals connected to the precharge voltage generator and the first terminal, and a gate terminal to which the inverted transmission control signal output from the inverter is applied.

12. The memory device according to claim 11, wherein the second transmission gate comprises:
a second PMOS transistor including source/drain terminals connected to the precharge voltage generator and the second terminal, and a gate terminal to which the transmission control signal is applied; and
a second NMOS transistor including source/drain terminals connected to the precharge voltage generator and the second terminal, and a gate terminal to which the inverted transmission control signal output from the inverter is applied.

13. The memory device according to claim 12, wherein the first and/or second NMOS transistors comprise:
a p-type substrate;
an n-band region formed in the p-type substrate;
a p-well formed in the n-band region;
a first n+ source/drain region and a second n+ source/drain region formed in the p-well and spaced apart from each other by a predetermined distance; and
a gate electrode between the first n+ region and the second n+ region,
wherein the first n+ source/drain region is coupled to an output of the precharge voltage generator, and wherein the second n+ source/drain region is coupled to one of the first terminal and the second terminal.

14. The memory device according to claim 13, wherein the first and/or second NMOS transistors further comprise:
a third n+ region and a fourth n+ region formed in the n-band region on opposite sides of the p-well,
wherein the third and fourth n+ regions are connected to the power supply voltage, and wherein the gate electrode is coupled to an output of the inverter.

15. The memory device according to claim 14, wherein the first and/or second NMOS transistors further comprise:
a p+ region formed in the p-well between the second n+ source/drain region and the fourth n+ region,
wherein the p+ region is coupled to the second voltage.

16. The memory device according to claim 13, wherein the n-band region separates the second n+ source/drain region and the p-well from the p-type substrate.

17. An integrated circuit memory device, comprising:
a memory cell array comprising first and second memory cells having a leakage current path therebetween;
first and second bit lines coupled to the first and second memory cells, respectively; and
a controller circuit coupled to the first and second bit lines and operable to provide first and second precharge voltages to the first and second bitlines, respectively,
wherein, during a burn-in test mode of operation, the controller is operable to provide the first and second precharge voltages such that a difference between the first and second precharge voltages is sufficient to remove the leakage current path between the first and second memory cells.

18. The memory device according to claim 17, wherein the controller is operable to provide a positive power supply voltage as the first precharge voltage and a negative stress voltage as the second precharge voltage during the burn-in test mode of operation.

19. The memory device according to claim 18, wherein the first and second bitlines comprise immediately adjacent bit lines, and further comprising:
a word line coupled to the first and second memory cells.

20. The memory device according to claim 19, wherein the controller circuit is operable to provide a reference voltage as the first and second precharge voltages during a normal mode of operation.

* * * * *